United States Patent
Liu et al.

(10) Patent No.: US 12,326,469 B2
(45) Date of Patent: Jun. 10, 2025

(54) METHOD OF DETERMINING LINE FAULT OF POWER SYSTEM

(71) Applicants: ABB Schweiz AG, Baden (CH); HITACHI ENERGY LTD, Zürich (CH)

(72) Inventors: Kai Liu, Beijing (CN); Qi Zhang, Fujian (CN)

(73) Assignees: ABB Schweiz AG, Baden (CH); HITACHI ENERGY LTD, Zürich (CH)

( * ) Notice: Subject to any disclaimer, the term of this patent is extended or adjusted under 35 U.S.C. 154(b) by 0 days.

(21) Appl. No.: 18/000,058

(22) PCT Filed: Aug. 11, 2020

(86) PCT No.: PCT/CN2020/108492
§ 371 (c)(1),
(2) Date: Nov. 28, 2022

(87) PCT Pub. No.: WO2022/032492
PCT Pub. Date: Feb. 17, 2022

(65) Prior Publication Data
US 2023/0236235 A1    Jul. 27, 2023

(51) Int. Cl.
*G01R 31/08* (2020.01)
*G01R 25/00* (2006.01)
(Continued)

(52) U.S. Cl.
CPC ......... *G01R 31/085* (2013.01); *G01R 25/005* (2013.01); *H02H 1/0007* (2013.01); *H02H 7/226* (2013.01)

(58) Field of Classification Search
CPC .. G01R 25/005; G01R 31/085; H02H 1/0007; H02H 3/405; H02H 7/226; Y04S 10/52
See application file for complete search history.

(56) References Cited

U.S. PATENT DOCUMENTS 3,983,377 A * 9/1976 Vitins ................. G01R 31/085 702/59
4,128,805 A * 12/1978 Lanz ................... G01R 31/085 324/727
(Continued)

FOREIGN PATENT DOCUMENTS

CN 101291056 A 10/2008
CN 102608498 A 7/2012
(Continued)

OTHER PUBLICATIONS

Benmouyal, G., et al.; "Zero-Setting Power-Swing Blocking Protection"; 3rd IEE international Confernece on Reliability of Transmission and Distribution Networks; 2005; 29 pages.
(Continued)

*Primary Examiner* — Vinh P Nguyen
(74) *Attorney, Agent, or Firm* — GREENBERG TRAURIG, LLP

(57) ABSTRACT

Methods for determining a line fault of a power system. The methods include obtaining sampled values of voltages and currents of phases of a power line in the power system, determining a phase compensation voltage of a first phase and an interphase compensation voltage of an interphase loop between a second phase and a third phase, and detecting the line fault in the first phase and/or the interphase loop by comparing the phase compensation voltage and the interphase compensation voltage.

18 Claims, 5 Drawing Sheets

(51) Int. Cl.
*H02H 1/00* (2006.01)
*H02H 7/22* (2006.01)

(56) References Cited

U.S. PATENT DOCUMENTS

| | | | | |
|---|---|---|---|---|
| 4,314,199 | A * | 2/1982 | Yamaura | G01R 31/088 |
| | | | | 324/521 |
| 5,578,931 | A * | 11/1996 | Russell | G01R 31/1272 |
| | | | | 324/536 |
| 8,022,709 | B2 * | 9/2011 | Wahlroos | H02H 3/402 |
| | | | | 361/48 |
| 11,656,263 | B2 * | 5/2023 | Cui | H02H 7/22 |
| | | | | 702/58 |
| 2013/0057297 | A1 | 3/2013 | Cheng et al. | |
| 2019/0004103 | A1 * | 1/2019 | Liu | G01R 31/52 |
| 2019/0379209 | A1 * | 12/2019 | Mohsenian-Rad | H02J 3/02 |

FOREIGN PATENT DOCUMENTS

| | | |
|---|---|---|
| CN | 103278742 A | 9/2013 |
| CN | 104730416 A | 6/2015 |
| CN | 104730417 A | 6/2015 |
| CN | 105846405 A | 8/2016 |
| CN | 109470991 A | 3/2019 |
| JP | 2018163065 A | 10/2018 |

OTHER PUBLICATIONS

Fischer, et al.; "Do System Impedances Really Affect Power Swings—Applying Power Swing Protection Elements Without Complex System Studies"; Schweitzer Engineering Laboratories, Inc.; 65th Annual Conference for Protective Relay Engineers; 2012; 14 pages.

Mechraoui, A. et al., "A New Principal for High Resistance Earth Fault Detection During Fast Power Swings for Distance Protection"; IEEE Transactions on Power Delivery, vol. 12, No. 4, 1997, pp. 1452-1457; 6 pages.

Xia, Y. Q., et al., "A Reliable Digital Directional Relay Based on Compensated Voltage Comparison for E. H. V. Transmission Lines"; 8047c IEEE Transactions on Power Delivery, 1992, vol. 7, No. 4, pp. 1955-1962; 8 pages.

* cited by examiner

METHOD OF DETERMINING LINE FAULT OF POWER SYSTEM

CROSS-REFERENCE TO RELATED APPLICATIONS

This is a national stage application claiming priority to International patent application Serial No.: PCT/CN2020/108492, filed on Aug. 11, 2020; which is herein incorporated by reference in its entirety.

FIELD

Embodiments of the present disclosure generally relate to a power system, and more specifically, to a method of determining a line fault of a power system.

BACKGROUND

Power Swing is basically caused by large disturbances in the power system. The power swing can cause load impedance, which may induce unwanted relay operations under steady state conditions at different network locations. These undesirable measurements may aggravate the power-system disturbance and cause major power outages, or even power blackout. Particularly, distance relays should not trip unexpectedly during dynamic system conditions such as stable or unstable power swings, and allow the power system to return to a stable operating condition.

Therefore, a Power Swing Block (PSB) function is adopted in modern relays to prevent unwanted distance relay element operation during power swing. The main purpose of the PSB function is to differentiate between power faults and power swings, and block distance or other relay elements from operation during a power swing.

That is, distance relays should be blocked during the power swing to avoid mal-trip. Once a distance relay is blocked, it cannot trip the fault immediately as in normal conditions. It needs the de-block method (such as I0/I2, I0 and I2 represent values of zero sequence current and negative sequence current, respectively) to de-block the distance relay to trip the fault. The operation performance of distance relay is seriously influenced by power swing. During power swing, the operation speed of distance relay is lowered and its ability to cover the fault resistance is lowered, etc.

SUMMARY

Embodiments of the present disclosure provide a method for determining a line fault of a power transmission system to at least in part to solve the above and other potential problems.

In a first aspect, a method of determining a line fault of a power system is provided. The method comprises obtaining sampled values of voltages and currents of phases of a power line in the power system, the phases at least comprising a first phase, a second phase and a third phase; determining, based on the sampled values of the voltages and currents, a phase compensation voltage of the first phase and an interphase compensation voltage of an interphase loop between the second and third phases; and detecting the line fault in the first phase and/or the interphase loop by comparing the phase compensation voltage and the interphase compensation voltage.

With the above method according to embodiments of the present disclosure, the mal-trip due to the power swing would be prevented. In this way, the relay does not need to be blocked during the power swing. Thus, the de-block criterions are no longer needed, resulting in an increased tripping speed.

In some embodiments, determining the phase compensation voltage comprises: obtaining a set impedance of the power line; determining a first phasor voltage and a first phasor current of the first phase based on the sampled values of the voltages and currents; and determining the phase compensation voltage at least based on the set impedance, the first phasor voltage and the first phasor current. In this way, the phase compensation voltage can be determined in an easier way.

In some embodiments, determining the phase compensation voltage further comprises: determining a compensation coefficient based on a zero sequence impedance and a positive sequence impedance of the power line; determining a second phasor current of the second phase and a third phasor current of the third phase based on the sampled values of the voltages and currents; determining a zero sequence current based on the first, second and third phasor currents; and determining the phase compensation voltage further based on the compensation coefficient and the zero sequence current. In this way, the phase compensation voltage can be determined more accurately.

In some embodiments, determining the interphase compensation voltage further comprises: determining a second compensation voltage of the second phase and a third compensation voltage of the third phase based on the sampled values of the voltages and currents; determining the interphase compensation voltage based on the second and/or third phase compensation voltages.

In some embodiments, detecting the line fault in the first phase and/or the interphase loop comprises: determining a phase angle between the phase compensation voltage and the interphase compensation voltage; and in accordance with a determination that the phase angle is within the predetermined range, determining the presence of the line fault in at least one of the first phase or the interphase loop.

In some embodiments, the phase compensation voltage and the interphase compensation voltage are determined in a time domain according to at least one of a time domain lumped parameter model or a telegraph equation model. With the above methods of determining the phase compensation voltage and the interphase compensation voltage in time domain, the influence on the fault determination due to the frequency such as the different frequencies of two power sources can be prevented, resulting in an improved reliability of the fault determination.

In some embodiments, determining the phase compensation voltage further comprises: obtaining a resistance of the power line and a phase inductance of the first, second and third phases and an interphase inductance among the first, second and third phases; and determining the phase compensation voltage in the time domain based on the resistance, the phase inductance, the interphase inductance, the sampled values of the voltages and currents, and a change rate of the sampled values of the currents.

In some embodiments, determining the phase compensation voltage further comprises: obtaining a positive sequence resistance, an inductance, a resistance compensation factor and an inductance compensation factor of the power line; determining a zero sequence current based on the sampled values of the voltages and currents; and determining the phase compensation voltage in the time domain based on the positive sequence resistance, the inductance, the sampled values of the voltages and currents and the zero sequence current.

In some embodiments, determining the interphase compensation voltage comprises: obtaining interphase sampled values of an interphase voltage and an interphase current between the second and third phases; and determining the interphase compensation voltage in the time domain based on the resistance, the inductance, the interphase sampled values, and a change rate of the interphase sampled value of the interphase current.

In some embodiments, detecting the line fault in the first phase and/or the interphase loop comprises: determining an operation voltage by calculating a first absolute value of the phase compensation voltage minus the interphase compensation voltage; determining a restrain voltage by calculating a second absolute value of the phase compensation voltage plus the interphase compensation voltage; and detecting the line fault in the first phase and/or the interphase loop by comparing the first absolute value with the second absolute value.

In a second aspect, an electronic device is provided. The electronic device comprises at least one processing unit; and at least one memory coupled to the at least one processing unit and storing instructions executable by the at least one processing unit, the instructions, when executed by the at least one processing unit, causing the device to perform the method as mentioned in the first aspect.

In some embodiments, the electronic device comprises a distance relay used in a power transmission system.

In a third aspect, a computer readable storage medium is provided. The computer readable storage medium has computer readable program instructions stored thereon which, when executed by a processing unit, cause the processing unit to perform the method as mentioned in the first aspect.

It is to be understood that the Summary is not intended to identify key or essential features of embodiments of the present disclosure, nor is it intended to be used to limit the scope of the present disclosure. Other features of the present disclosure will become easily comprehensible through the description below.

BRIEF DESCRIPTION OF THE DRAWINGS

The above and other objectives, features and advantages of the present disclosure will become more apparent through more detailed depiction of example embodiments of the present disclosure in conjunction with the accompanying drawings, wherein in the example embodiments of the present disclosure, the same reference numerals usually represent the same components.

Throughout the drawings, the same or similar reference symbols are used to indicate the same or similar elements.

DETAILED DESCRIPTION

Figure 1:
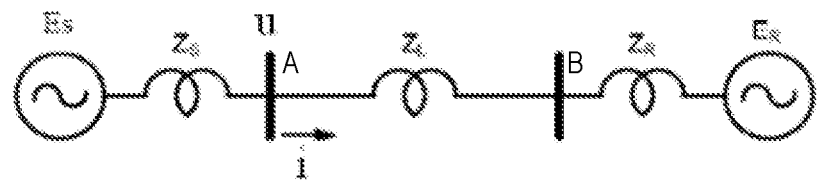
FIG. 1 shows illustrates a simple two-source system connected by a transmission line of impedance according to embodiments of the present disclosure.

The present disclosure will now be discussed with reference to several example embodiments. It is to be understood these embodiments are discussed only for the purpose of enabling those persons of ordinary skill in the art to better understand and thus implement the present disclosure, rather than suggesting any limitations on the scope of the subject matter.

As used herein, the term "comprises" and its variants are to be read as open terms that mean "comprises, but is not limited to." The term "based on" is to be read as "based at least in part on." The term "one embodiment" and "an embodiment" are to be read as "at least one embodiment." The term "another embodiment" is to be read as "at least one other embodiment." The terms "first," "second," and the like may refer to different or the same objects. Other definitions, explicit and implicit, may be comprised below. A definition of a term is consistent throughout the description unless the context clearly indicates otherwise.

As mentioned above, power swings may lead to distance relay mis-operation due to variations in system current and voltage magnitudes. PSB function is crucial to distinguish power swings and fault properly and prevent relay pickup during power swings to avoid unintended outage of the transmission lines. Moreover, the relay should initiate a trip command in case of fault during power swing.

Therefore, fault detection is more challenging during asymmetrical power swing since open-pole condition introduces a large amount of negative and zero sequence components in voltage and current signals. Most power-swing blocking elements are based on traditional methods that monitor the rate of change of the positive-sequence impedance. The required settings for the power-swing blocking elements could be difficult to calculate in many applications, particularly those where fast swings can be expected.

Some traditional relays use zero sequence current to de-block the relay to trip the earth fault during power swing. Specifically, the power swing protection of such traditional relays detects the negative/zero sequence current (I2/I0) to de-block the distance relay to trip the fault, which has a prolonged response speed. Especially when fault resistance exists, it usually takes a long time to trip the fault. Moreover, if the fault resistance is relatively large, i.e., the ratio of negative/zero sequence current (I2/I0) is small, the power swing protection may fail to de-block the relay, so the fault cannot be tripped.

In order to at least partially address the above and other potential problems, embodiments of the present disclosure provide a method of determining a line fault of a power transmission system. After the line fault has been determined or detected, especially during the power swing, distance relays and/or circuit breakers or the like may be controlled to trip the line fault. In this way, the safety of power transmission lines can be effectively improved. The embodiments of the present disclosure will be described mainly by taking a distance relay as a protection device as an example. It should be understood that any other suitable protection devices are also possible.

In operation, the distance relay usually measures the impedance of the line and compares the measured impedance with a set impedance. If the measured impedance is below the actual value, the relay is set to operate and isolate the faulted section after an appropriate delayed time.

For ease of discussion, an equivalent power system is introduced, as shown in FIG. 1, which illustrates a simple two-source system connected by a transmission line of impedance $Z_L$. As shown in FIG. 1, $E_S$ and $E_R$ are the power source voltages at two ends. The voltage $E_S$ leads $E_R$ by an angle $\alpha$ so that power flows from A to B during a steady state.

During power swing such as Out-of Step (OOS) conditions, a distance relay may detect OOS as a phase fault if the measured impedance's trajectory enters the operating characteristic of the relay. To demonstrate this, let us look at the impedance that a distance relay measures during an OOS condition for the simple two-source system as shown in FIG. 1. The impedance measured at a relay at bus A can be calculated by the equation below.

$$Z_{Mea} = \frac{Z_S + Z_L + Z_R}{2}\left(1 - j\cot\frac{\alpha}{2}\right) - Z_S \qquad (1)$$

wherein $Z_{Mea}$ represents the measured impedance; $Z_S$ represents the impedance of the an impedance of the power source which has a voltage $E_S$; and $Z_R$ represents the impedance of an impedance of the power source which has a voltage $E_R$. Assume the impedances $Z_S$, $Z_R$, $Z_L$ have the same impedance angle and $E_S=E_R$, then the trajectory of the measured impedance $Z_{Mea}$ is a straight line, as shown with a dotted line in FIG. 2.

Figure 2:
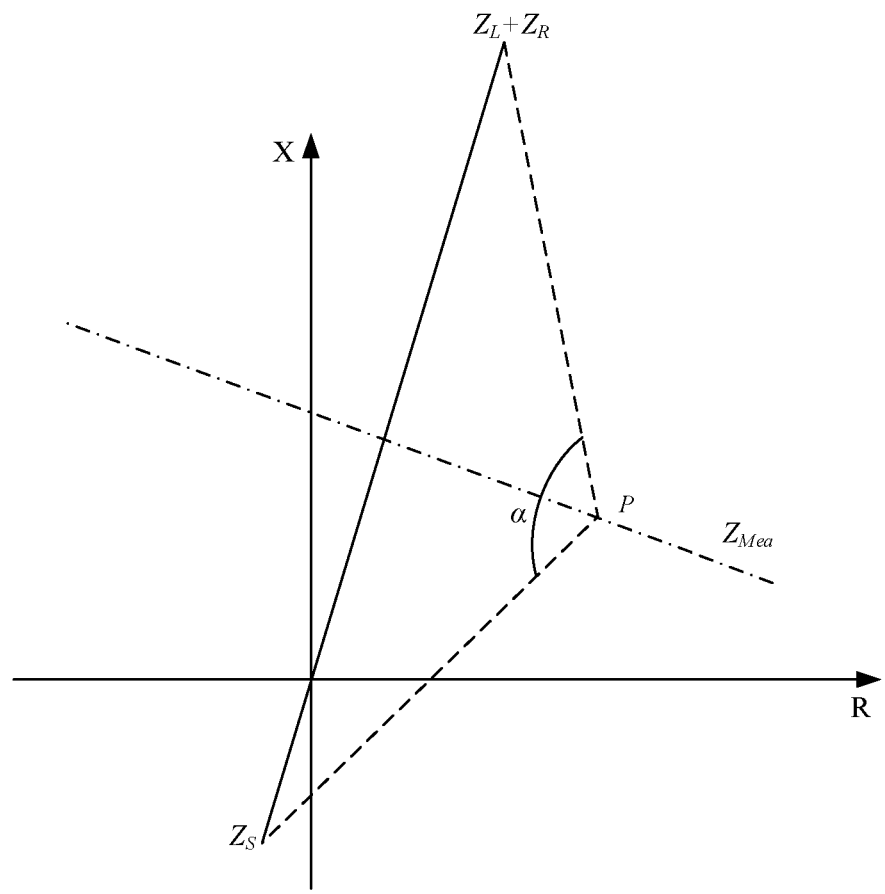
FIG. 2 shows a trajectory of the measured impedance according to embodiments of the present disclosure.

As shown in FIG. 2, during a power swing when the angle $\alpha$ between the two source voltages vary, the trajectory of the measured impedance at the relay corresponds to the straight line that intersects the segment $Z_S$ to $Z_R+Z_L$ at its middle point P. This point P is called the electrical center of the power swing. The angle $\alpha$ between the two segments that connect P to points $Z_S$ and $Z_R+Z_L$ is equal to the angle $\alpha$. When the angle $\alpha$ reaches the value of 180 degrees, the impedance is precisely at the location of the electrical center.

Figure 3:
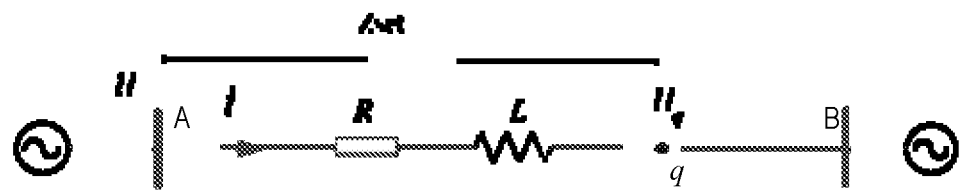
FIG. 3 shows another form of equivalent power system according to embodiments of the present disclosure.

Another concept to be introduced is a compensation voltage. As shown in FIG. 3, which shows another form of an equivalent power system, the compensation voltage is defined as a calculated voltage at a pre-set or sampling point at which the relay is installed in the transmission line. Specifically, in FIG. 3, the compensation voltage is defined as a calculated voltage at the point q.

The compensation voltage $\dot{U}_q$ can be calculated in a frequency domain with the equation below.

$$\dot{U}_q = \dot{U} - \dot{I}Z_{set} \qquad (2)$$

wherein $\dot{U}$ and $\dot{I}$ represent a phasor voltage and a phasor current of the power line, respectively; and $Z_{set}$ is a set impedance of the power line, which is usually set to be 80%-85% of the total impedance of the power line.

The angle $\delta$ between the compensation voltage and the local voltage can be defined with the equation below.

$$\delta = \arg(\dot{U}_q/\dot{U}) \qquad (3)$$

It can be found from the above equations that during power swing, both the measured impedance $Z_{Mea}$ and the angle $\delta$ would change periodically. There is a certain relationship between measured impedance $Z_{Mea}$, the angle $\delta$, and the operation characteristics of the relay.

Figure 4:
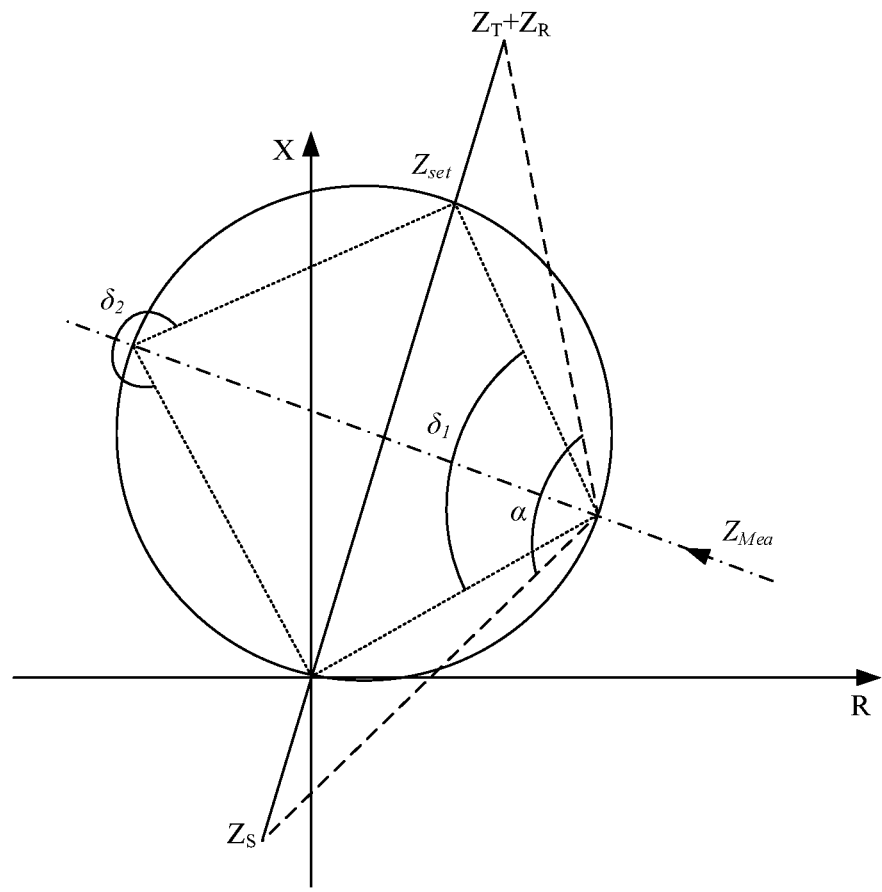
FIG. 4 shows a relationship between measured impedance $Z_{Mea}$, the angle δ, and the operation characteristics of the mho relay according to another embodiment of the present disclosure.

For simplicity, an mho relay, whose model is expressed by equation (4) below, is used as an example of the relay to discuss the embodiments of the present disclosure. It is to be understood that other types of relays are also possible. FIG. 4 shows the relationship between measured impedance $Z_{Mea}$, the angle $\delta$, and the operation characteristics of the mho relay. The operation characteristics of the mho relay are shown in FIG. 4 in a form of a circle, which has a center at $Z_{set}/2$ and a radius of $|Z_{set}/2|$.

As mentioned above, a distance relay may detect a phase fault if the trajectory of the measured impedance $Z_{Mea}$ is within the operating characteristic of the relay, which can be expressed as the equation below.

$$90° < \arg\frac{\dot{U} - Z_{set}\dot{I}}{\dot{U}} < 270° \qquad (4)$$

wherein $\dot{U}$ and $\dot{I}$ represent a phasor voltage and a phasor current of the power line, respectively; and $Z_{set}$ is a setting impedance of the power line.

Specifically, when the measured impedance $Z_{Mea}$ enters the operation characteristics of mho relay, $\delta_1=90°$. And when the measured impedance $Z_{Mea}$ leaves the operation characteristics of mho relay, $\delta_2=270°$. Thus, when the angle $\delta$ meets the requirement as shown in the above equation (4), the mho relay operates.

In a context of the present disclosure, a three-phase transmission line is taken as an example to describe the embodiments of the present disclosure. It should be understood that transmission lines with other phase numbers are also applicable. As we all know, the three-phase transmission line typically has six loops composed of the three phases and three interphase loops. Based on the above equation (2), the compensation voltages of the six loops, including phase compensation voltages and interphase compensation voltages, can be determined by the equation below.

$$\begin{cases} \dot{U}_{qa} = \dot{U}_a - (\dot{I}_a + 3k\dot{I}_0)Z_{set} \\ \dot{U}_{qb} = \dot{U}_b - (\dot{I}_b + 3k\dot{I}_0)Z_{set} \\ \dot{U}_{qc} = \dot{U}_c - (\dot{I}_c + 3k\dot{I}_0)Z_{set} \\ \dot{U}_{qab} = \dot{U}_{qa} - \dot{U}_{qb} \\ \dot{U}_{qbc} = \dot{U}_{qb} - \dot{U}_{qc} \\ \dot{U}_{qca} = \dot{U}_{qc} - \dot{U}_{qa} \end{cases} \qquad (5)$$

wherein $\dot{U}_{qa}$, $\dot{U}_{qb}$, $\dot{U}_{qc}$ represent phase compensation voltages of phases A, B, C at the pre-set points; $\dot{U}_{qab}$, $\dot{U}_{qbc}$, $\dot{U}_{qca}$ represent interphase compensation voltages of interphase loops AB, BC, CA; $\dot{I}_a$, $\dot{I}_b$, $\dot{I}_c$ represent phasor currents of phases A, B, C; $\dot{U}_a$, $\dot{U}_b$, $\dot{U}_c$ represent phasor voltages of phases A, B, C; $\dot{I}_0$ represents a zero sequence current of the power line; and k represents a zero sequence compensation coefficient, which can be determined by the equation below.

$$k = \frac{Z_0 - Z_1}{3Z_1} \qquad (6)$$

wherein $Z_0$, $Z_1$ represent a zero sequence impedance and a positive sequence impedance of the power line, respectively.

Figure 5:
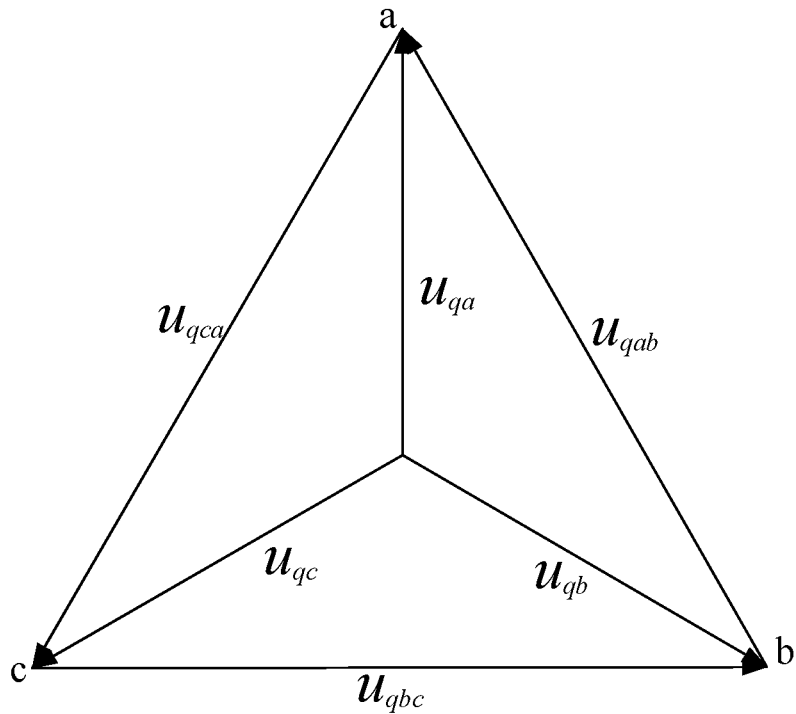
FIG. 5 shows a diagram illustrating the three-phase vectors of the compensation voltages according to another embodiment of the present disclosure.

Based on the above equation (5), we can draw a diagram illustrating the three-phase vectors of the compensation voltages, as shown in FIG. 5. As shown in FIG. 5, clearly, during power swing, the angles of $\dot{U}_{qa}$, $\dot{U}_{qb}$, and $\dot{U}_{qc}$ differ from each other by 120° and the vector of the voltage of one phase is perpendicular to the vector of the voltage of interphase loop between the other two phases. That is, no matter it is during normal state or during power swings, in the absence of the line fault, the phase angles between $\dot{U}_{qa}$ and $\dot{U}_b c$, $\dot{U}_{qb}$ and $\dot{U}_{qca}$, and $\dot{U}_{qc}$ and $\dot{U}_{qab}$ can be expressed by the equation below.

$$\arg\frac{\dot{U}_{qa}}{\dot{U}_{qbc}} = \arg\frac{\dot{U}_{qb}}{\dot{U}_{qca}} = \arg\frac{\dot{U}_{qc}}{\dot{U}_{qab}} = 90° \quad (7\text{-}1)$$

It can be known from the above equation (7-1) that if the phasor compensation voltages of interphase loops are rotated by 90°, respectively, that is, $\dot{U}_{qbc}e^{j90°}$, $\dot{U}_{qab}e^{j90°}$, and $\dot{U}_{qca}e^{j90°}$, the angle between $\dot{U}_{qa}$ and $\dot{U}_{qbc}e^{j90°}$, $\dot{U}_{qb}$ and $\dot{U}_{qca}e^{j90°}$ and $\dot{U}_{qc}$ and $\dot{U}_{qab}e^{j90°}$ is always 0°.

Furthermore, in the absence of the line fault, the angle between the phasor compensation voltage of a phase and the phasor compensation voltage of any of the other two phases after being rotated by a certain angle is always 0°, which can be expressed by the equation below:

$$\begin{cases} \arg\dfrac{\dot{U}_{qa}}{\dot{U}_{qb}e^{j120°}} = \arg\dfrac{\dot{U}_{qa}}{\dot{U}_{qc}e^{j240°}} = 0° \\ \arg\dfrac{\dot{U}_{qb}}{\dot{U}_{qc}e^{j120°}} = \arg\dfrac{\dot{U}_{qa}}{\dot{U}_{qa}e^{j240°}} = 0° \\ \arg\dfrac{\dot{U}_{qc}}{\dot{U}_{qa}e^{j120°}} = \arg\dfrac{\dot{U}_{qa}}{\dot{U}_{qb}e^{j240°}} = 0° \end{cases} \quad (7\text{-}2)$$

wherein $\dot{U}_{qa}$, $\dot{U}_{qb}$, $\dot{U}_{qc}$ represent phase compensation voltages of phases A, B, C at the pre-set points; $\dot{U}_{qb}e^{j120°}$, $\dot{U}_{qc}e^{j120°}$ and $\dot{U}_{qa}e^{j120°}$ represent compensation voltages $\dot{U}_{qb}$, $\dot{U}_{qc}$, and $\dot{U}_{qa}$ after rotating 120°; and $\dot{U}_{qb}e^{j240°}$, $\dot{U}_{qc}e^{j240°}$, and $\dot{U}_{qa}e^{j240°}$ represent compensation voltages $\dot{U}_{qb}$, $\dot{U}_{qc}$, and $\dot{U}_{qa}$ after rotating 240°.

Based on the fixed relationship between any two phases in the absence of the line fault, the interphase compensation voltage herein can also be expressed by rotating one phase compensation voltage by a certain angle as mentioned above. In the course of their research, the inventors have discovered that when an internal fault occurs, the angle between one phase compensation voltage and the interphase compensation voltage would be changed. For example, when there is an internal fault that occurs in phase A, the phase angle of compensation voltage $\dot{U}_{qa}$ would be changed by 180°, for example, while the phase angle of $\dot{U}_{qbc}$ would not be changed. Thus, the angle between $\dot{U}_{qa}$ and $\dot{U}_{qbc}e^{j90°}$ becomes 180°.

Figure 6:
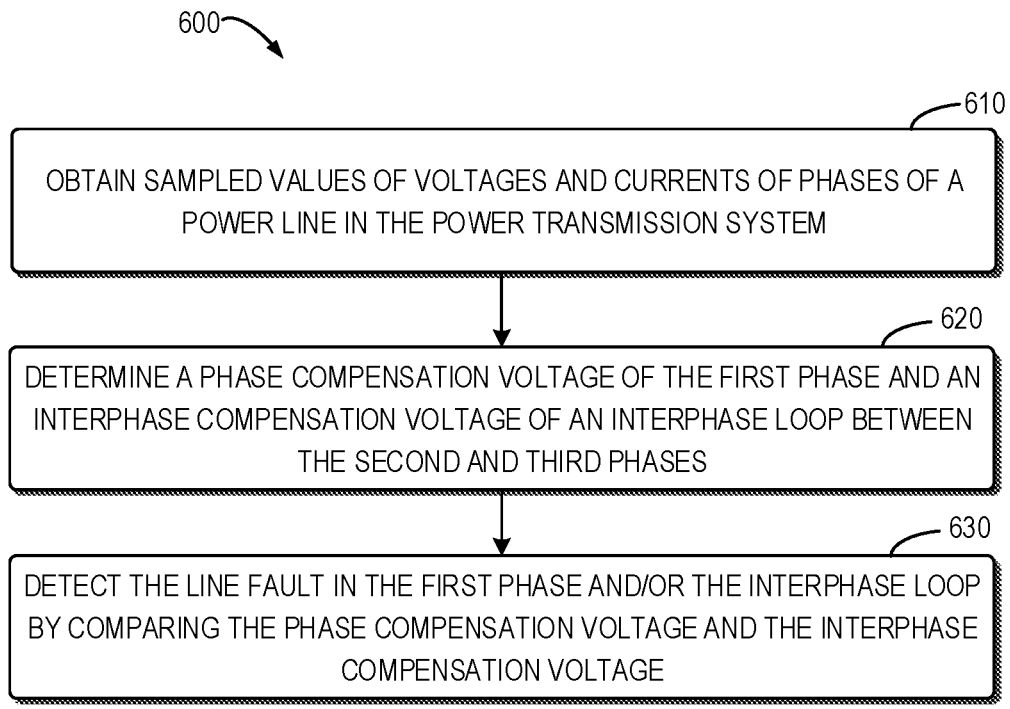
FIG. 6 shows a flowchart illustrating a method for determining a line fault of a power transmission system according to embodiments of the present disclosure.

Based on this discovery, the inventors proposed a method to determine the line fault and thus trip the fault rapidly. FIG. 6 shows a flowchart illustrating a method for determining a line fault of a power transmission system according to embodiments of the present disclosure. The method can be performed by a processing unit or a controller of an electronic device such as the relay as mentioned above. For example, in some embodiments, the processing unit for performing the method may be an integral part of the existing processor or a control unit arranged in the relay. In some alternative embodiments, the processor for performing the method may also be another processor independent of the relay's existing processor.

In some further alternative embodiments, the processor may also be a processor of a device such as a computer located outside the relay. Actually, any suitable processor that can perform the method below may be used.

As shown in FIG. 6, in block 610, the sampled values of voltages and currents of phases of the power line are obtained. As mentioned above, the embodiments of the present disclosure will be described mainly by taking a three-phase transmission line common in the art as an example. For ease of description, the three phases in the transmission line used herein will be referred to as a first phase, a second phase and a third phase, respectively. It is to be appreciated that the terms "first", "second" and "third" herein are merely used as identifiers and do not imply a ranking. The first phase, the second phase or the third phase can refer to any of phases A, B, and C. For example, when the first phase refers to phase A, then the interphase loop between the second and third phases refers to an interphase loop BC.

In some embodiments, the sampled values of the voltages and currents may be obtained by the relay, such as the mho relay arranged at pre-set or sampling points of the power line. Besides the sampled values of the voltages and currents of the first, second and third phases, the sampled values of voltages and currents of interphase loops such as among the first, second and third phases may also be obtained. In some alternative embodiments, the sampled values of the voltages and currents may also be obtained using separated sensors.

After the sampled values of the voltages and currents are obtained, in block 620, based on the sampled values of the voltages and currents, a phase compensation voltage of the first phase and an interphase compensation voltage of the interphase loop between the second and third phases can be determined.

For example, in some embodiments, the phase compensation voltage and the interphase compensation voltage as mentioned above can be determined according to the above equation (2). In such a case, the set impedance of the power line as mentioned above may be obtained. In addition, a first phasor voltage and a first phasor current of the first phase may be determined based on the above obtained sample values of the voltages and currents according to suitable modules, such as the Fourier transform module or the like. Then the phase compensation voltage can be determined based on the set impedance, the first phasor voltage and first phasor current according to the above equation (2).

It is to be understood that although the phase compensation voltage and the interphase compensation voltages are described as determined based on equation (2), the present disclosure is not limited to these embodiments. In fact, it is possible to use any suitable form of differential equations.

For example, in some embodiments, the phase compensation voltage and the interphase compensation voltage may also be determined based on the equation (5). In those embodiments, the zero sequence compensation coefficient k may be determined first based on the zero sequence impedance $Z_0$ and a positive sequence impedance $Z_1$ of the power line according to the equation (6). In addition, the zero sequence current $\dot{I}_0$ may be determined in any suitable way. For example, in some embodiments, a second phasor current of the second phase and a third phasor current of the third phase may be determined first based on the sample values of the voltages and currents. Then the zero sequence current $\dot{I}_0$ may be determined based on the first, second and third phasor currents.

With the above compensation coefficient and the zero sequence current, the phase compensation voltage $\dot{U}_q$ may be determined according to the above equation (5). Similarly, a second compensation voltage of the second phase and a third compensation voltage of the third phase may be determined based on the sample values of the voltages and currents in ways similar to those as mentioned above. In some embodiments, the interphase compensation voltage may be determined based on the second and third phase compensation voltages according to the above equation (5).

After the phase compensation voltage and the interphase compensation voltage are determined, in block 630, the line fault in the first phase and/or the interphase loop can be detected by comparing the phase compensation voltage with the interphase compensation voltage.

In some embodiments, the phase compensation voltage may be compared with the interphase compensation voltage by determining a phase angle between the phase compensation voltage and the interphase compensation voltage. Then, it can be determined that there is a line fault in the first phase and/or the interphase loop between the second and third phases in accordance with a determination that the phase angle is within the predetermined range.

As mentioned above, when there is no fault in the power line, the phase angle between the phase compensation voltage of the first phase and the interphase compensation voltage between the second and third phases is fixed, i.e., 90°. When there is a line fault in the first phase and/or the interphase loop between the second and third phases, the phase angle between the phase compensation voltage of the first phase and the interphase compensation voltage between the second and third phases would be changed.

Thus, it can be determined that there is a line fault in the first phase and/or the interphase loop between the second and third phases based on the changed angle between the phase compensation voltage and the interphase compensation voltage. Specifically, in some embodiments, the phase fault of the first phase and/or the interphase fault between the second and third phases may be determined in accordance with a determination that the phase angle is within the predetermined range which is expressed by the equation below:

$$\begin{cases} LA\ 270° \geq \arg\dfrac{\dot{U}_{qbc} \times e^{j90°}}{\dot{U}_{qa}} \geq 90° \\ LB\ 270° \geq \arg\dfrac{\dot{U}_{qca} \times e^{j90°}}{\dot{U}_{qb}} \geq 90° \\ LC\ 270° \geq \arg\dfrac{\dot{U}_{qab} \times e^{j90°}}{\dot{U}_{qc}} \geq 90° \end{cases} \quad (8)$$

wherein $\dot{U}_{qbc} \times e^{j90°}$ represents an interphase compensation voltage $\dot{U}_{qbc}$ between phases B and C after rotating 90°; $\dot{U}_{qca} \times e^{j90°}$ represents an interphase compensation voltage $\dot{U}_{qca}$ between phases A and C after rotating 90°; and $\dot{U}_{qab} \times e^{j90°}$ represents an interphase compensation voltage $\dot{U}_{qab}$ between phases A and B after rotating 90°.

Furthermore, as mentioned above, according to equations (7-1) and (7-2), the above parameters $\dot{U}_{qbc} \times e^{j90°}$, $\dot{U}_{qca} \times e^{j90°}$, and $\dot{U}_{qab} \times e^{j90°}$ in the equation (8) may also be expressed by rotating one phase compensation voltage by a certain angle $\dot{U}_{qb} e^{j120°}$, $\dot{U}_{qc} e^{j120°}$ and $\dot{U}_{qa} e^{j120°}$ or $\dot{U}_{qb} e^{j240°}$, $\dot{U}_{qc} e^{j240°}$, and $\dot{U}_{qa} e^{j240°}$. Embodiments of the present disclosure will be described mainly by using the equation (5) to determine the interphase compensation voltage as an example. It should be understood that determining the interphase compensation voltage by rotating one phase compensation voltage by a certain angle as expressed in equation (7-2) is similar, which will not be repeated below.

Figure 7:
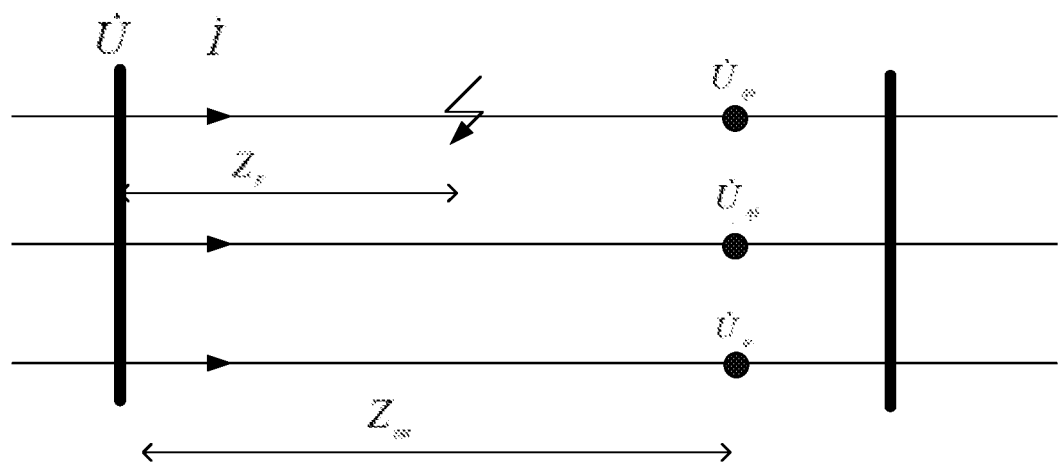
FIG. 7 shows an equivalent power system with an internal fault of phase A according to embodiments of the present disclosure.

Next, we will take the internal fault of phase A as an example to verify the effectiveness of the above method. FIG. 7 shows an equivalent power system with an internal fault of phase A. When there is an internal fault of phase A, $\dot{U}_{qa}$ and $\dot{U}_{qbc}$ can be determined from the equations below.

$$\dot{U}_{qa} = \dot{U}_a - \dfrac{\dot{U}_a}{Z_F} \times Z_{set} = \dot{U}_a\left(1 - \dfrac{Z_{set}}{Z_F}\right) \quad (9)$$

$$\dot{U}_{qbc} = \dot{U}_{bc} - \dot{I}_{bc} \times Z_{set} = \dot{U}_{bc} - \dfrac{\dot{U}_{bc}}{Z_{Mea}} \times Z_{set} = \dot{U}_{bc}\left(1 - \dfrac{Z_{set}}{Z_{Mea}}\right) \quad (10)$$

wherein $Z_F$ represents the impedance from the bus A to a point where the internal fault occurs, $\dot{U}_{qa}$ represents phase compensation voltages of phase A, $\dot{U}_{qbc}$ represents the interphase compensation voltage of interphase loops BC, $Z_{set}$ is a set impedance of the power line, $Z_{Mea}$ is a measured impedance of the power line at the relay and $\dot{U}_a$ represents phasor voltages of phases A.

From the above equations (9) and (10), we can compare $\dot{U}_{qa}$ and $\dot{U}_{qbc} e^{j90°}$ with the equation below:

$$\dfrac{\dot{U}_{qbc} e^{j90°}}{\dot{U}_{qa}} = \quad (11)$$

$$\dfrac{\dot{U}_{bc} e^{j90°}\left(1 - \dfrac{Z_{set}}{Z_{Mea}}\right)}{\dot{U}_a\left(1 - \dfrac{Z_{set}}{Z_F}\right)} = \dfrac{\dot{U}_{bc} e^{j90°}}{\dot{U}_a\left(1 - \dfrac{Z_{set}}{Z_F}\right)} \times \dfrac{Z_{Mea} - Z_{set}}{Z_{Mea}} = -k \times \dfrac{Z_{Mea} - Z_{set}}{Z_{Mea}}$$

wherein $Z_F$ represents the impedance from the bus A to a point where the internal fault occurs, $\dot{U}_{qa}$ represents phase compensation voltages of phase A, $\dot{U}_{qbc} e^{j90°}$ represents the interphase compensation voltage of interphase loops BC rotated by 90°, $Z_{set}$ is a set impedance of the power line, $Z_{Mea}$ is a measured impedance of the power line at the relay and $\dot{U}_a$ represents phasor voltages of phases A.

In the above equation (11), because $Z_F < Z_{Set}$, k is a positive real constant. Furthermore, considering that $Z_{Mea} = \dot{U}_{bc}/\dot{I}_{bc}$, the angle between $\dot{U}_{qa}$ and $\dot{U}_{qbc} e^{j90°}$ can be determined with the equation below.

$$\begin{cases} \dfrac{Z_{Mea} - Z_{set}}{Z_{Mea}} = \dfrac{\dot{U}_{bc}/\dot{I}_{bc} - Z_{set}}{\dot{U}_{bc}/\dot{I}_{bc}} = \dfrac{\dot{U}_{bc} - \dot{I}_{bc} Z_{set}}{\dot{U}_{bc}} \\ \arg\dfrac{\dot{U}_{qbc} e^{j90°}}{\dot{U}_{qa}} = -\arg\dfrac{Z_{Mea} - Z_{set}}{Z_{Mea}} = -\delta_{bc} \end{cases} \quad (12)$$

From the above equation (12), when $$-90° < \arg\dfrac{\dot{U}_{bc} - \dot{I}_{bc} Z_{set}}{\dot{U}_{bc}} < 90°, \text{ and} \quad (13)$$

-continued $$\text{i.e., } 90° < \arg\frac{\dot{U}_{qbc}e^{j90°}}{\dot{U}_{qa}} < 270° \quad (14)$$

it can be determined that there is the fault in the phase A. Accordingly, the internal fault can be tripped in any suitable way.

It can be seen that with the above method according to embodiments of the present disclosure, the mal-trip due to the power swing would be prevented. In this way, the relay does not need to be blocked during the power swing. Thus, the de-block criteria are no longer needed, resulting in an increased tripping speed.

Figure 8:
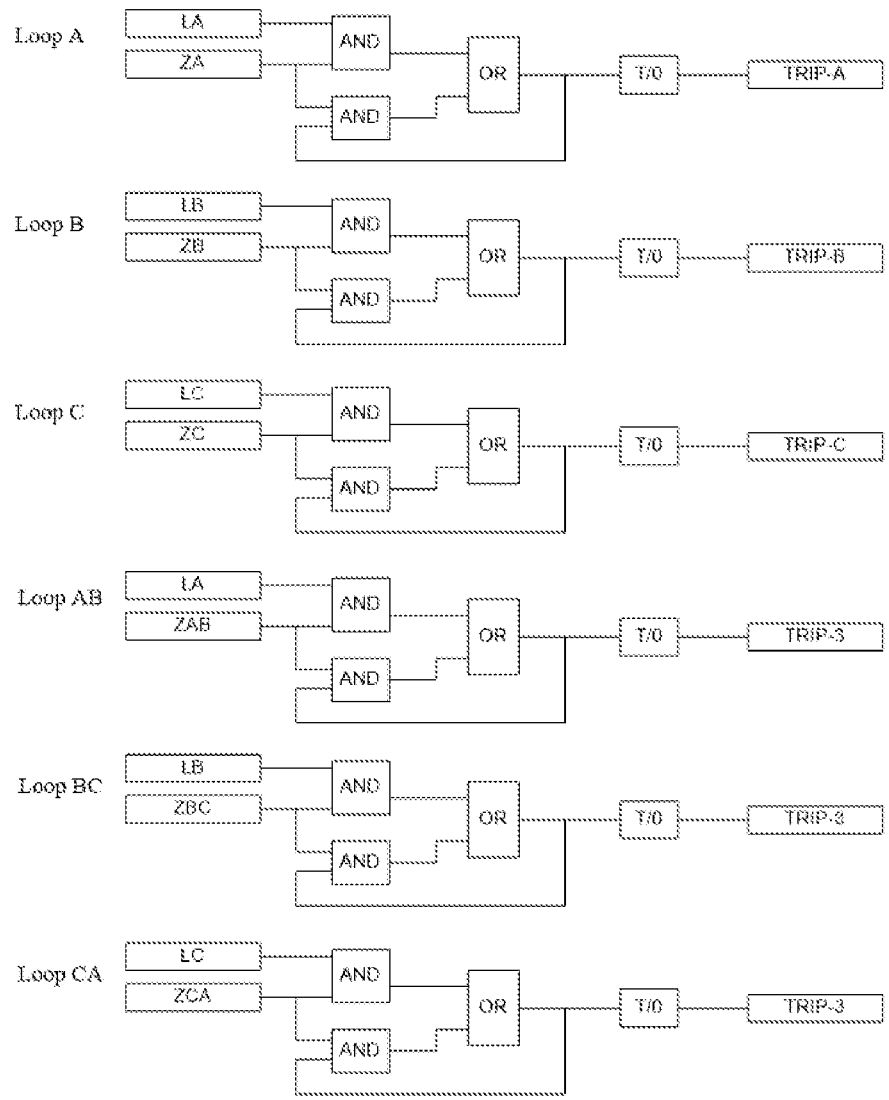
FIG. 8 shows an example logic diagram of the method according to embodiments of the present disclosure working with existing methods.

Alternatively and additionally, the above method according to embodiments of the present application may also work together with the existing method such as I2/I0 as mentioned above to determine or detect the fault more accurately. FIG. 8 shows an example logic diagram of the method according to embodiments of the present disclosure worked with existing methods.

As shown in FIG. 8, LA, LB and LC represent the fault determination method according to embodiments of the present disclosure for phases A, B and C; ZA, ZB, ZC, ZAB, ZBC and ZCA represent an existing fault determination method during power swing; T represents a delay time to ensure the reliability of the fault determination.

Furthermore, the above equations (2) and (5) are both frequency related. That is, when the frequencies of the voltages of the two-power source as illustrated in the equivalent power system of FIG. 1 are inconsistent, the compensation voltages determined according to the above equations may be inaccurate.

In order to further improve the reliability of fault determination without being affected by frequency, in some embodiments, alternatively or additionally, the compensation voltages may also be determined in a time domain according to a time domain lumped parameter model.

For example, in some embodiments, the phase compensation voltage may be determined in the time domain based on a positive sequence resistance of the power line, a phase inductance $L_s$ of the first, second and third phases, an interphase inductance $L_m$ among the first, second and third phases and the above obtained sample values of the voltages and currents. In those embodiments, the positive sequence resistance of the power line, the phase inductance and the interphase inductance. For example, the phase compensation voltages $u_{q\_a\_k}$, $u_{q\_b\_k}$ and $u_{q\_c\_k}$ can be determined based on differential equations such as:

$$\begin{cases} u_{q\_a\_k} = u_{a\_k} - \left[R \cdot i_{a\_k} + L_s \cdot \frac{di_{a\_k}}{dt} + L_m \cdot \frac{di_{b\_k}}{dt} + L_m \cdot \frac{di_{c\_k}}{dt}\right] \\ u_{q\_b\_k} = u_{b\_k} - \left[R \cdot i_{b\_k} + L_s \cdot \frac{di_{b\_k}}{dt} + L_m \cdot \frac{di_{a\_k}}{dt} + L_m \cdot \frac{di_{c\_k}}{dt}\right] \\ u_{q\_c\_k} = u_{c\_k} - \left[R \cdot i_{c\_k} + L_s \cdot \frac{di_{c\_k}}{dt} + L_m \cdot \frac{di_{a\_k}}{dt} + L_m \cdot \frac{di_{b\_k}}{dt}\right] \end{cases} \quad (15)$$

wherein $u_{a\_k}$, $u_{b\_k}$ and $u_{c\_k}$ respectively represent line voltages for phase A, phase B and phase C at the sampling point; $i_{a\_k}$, $i_{b\_k}$ and $i_{c\_k}$ respectively represent currents for phase A, phase B and phase C at the sampling point; $L_s$ represents the phase inductance for phase A, phase B and phase C; and $L_m$ represents the interphase inductance among phase A, phase B and phase C.

Since the interphase voltage is a voltage difference between one phase and another phase, the interphase compensation voltages $u_{q\_ab\_k}$, $u_{q\_bc\_k}$ and $u_{q\_ca\_k}$ can be further determined based on the phase compensation voltages $u_{q\_a\_k}$, $u_{q\_b\_k}$ and $u_{q\_c\_k}$ determined based on equation (15). For example, the interphase compensation voltage $u_{q\_ab\_k}$, i.e., the voltage between phases A and B at the sampling point, can be determined by:

$$u_{q\_ab\_k} = u_{q\_a\_k} - u_{q\_b\_k} = u_{ab\_k} - \left[R \cdot i_{ab\_k} + (L_s - L_m) \cdot \frac{di_{ab\_k}}{dt}\right] \quad (16)$$
$$= u_{ab\_k} - \left[R \cdot i_{ab\_k} + L \cdot \frac{di_{ab\_k}}{dt}\right]$$

wherein $u_{ab\_k}$, $i_{ab\_k}$ respectively represent the voltage and current between phase A and phase B at the sampling point; R and L mean a positive sequence resistance and inductance for the phase line, L is equal to the difference of $L_s$ and $L_m$, i.e., $L = L_s - L_m$.

According to the differential equation (16), the interphase compensation voltages $u_{q\_ab\_k}$, $u_{q\_bc\_k}$ and $u_{q\_ca\_k}$ can be determined by differential equations such as $$\begin{cases} u_{q\_ab\_k} = u_{ab\_k} - \left(R \cdot i_{ab\_k} + L \cdot \frac{di_{ab\_k}}{dt}\right) \\ u_{q\_bc\_k} = u_{bc\_k} - \left(R \cdot i_{bc\_k} + L \cdot \frac{di_{bc\_k}}{dt}\right) \\ u_{q\_ca\_k} = u_{ca\_k} - \left(R \cdot i_{ca\_k} + L \cdot \frac{di_{ca\_k}}{dt}\right) \end{cases} \quad (17)$$

wherein $u_{ab\_k}$, $i_{ab\_k}$ respectively represent the voltage and current between phase A and phase B at the sampling point; $u_{bc\_k}$, $i_{bc\_k}$ respectively represent the voltage and current between phase B and phase C at the sampling point; $u_{ca\_k}$, $i_{ca\_k}$ respectively represent the voltage and current between phase C and phase A at the sampling point; R and L mean the positive sequence resistance and inductance for the phase line, L is equal to the difference of $L_s$ and $L_m$, i.e., $L = L_s - L_m$.

Thus, we can determine the phase compensation voltages $u_{q\_a\_k}$, $u_{q\_b\_k}$ and $u_{q\_c\_k}$ and the interphase compensation voltages $u_{q\_ab\_k}$, $u_{q\_bc\_k}$ and $u_{q\_ca\_k}$ in a time domain. It shall be understood that although the phase compensation voltages $u_{q\_a\_k}$, $u_{q\_b\_k}$ and $u_{q\_c\_k}$ and the interphase compensation voltages $u_{q\_ab\_k}$, $u_{q\_bc\_k}$ and $u_{q\_ca\_k}$ are described as to be determined based on equations (16) and (17) respectively, the present disclosure is not limited to these embodiments. In fact, it is possible to use any suitable form of differential equations.

For example, the phase compensation voltages $u_{q\_a\_k}$, $u_{q\_b\_k}$ and $u_{q\_c\_k}$ can be determined based on the following equations.

$$\begin{cases} u_{q\_a\_k} = u_{a\_k} - \left[R \cdot (i_{a\_k} + k_R \cdot 3i_{0\_k}) + L \cdot \frac{d(i_{a\_k} + k_L \cdot 3i_{0\_k})}{dt}\right] \\ u_{q\_b\_k} = u_{b\_k} - \left[R \cdot (i_{b\_k} + k_R \cdot 3i_{0\_k}) + L \cdot \frac{d(i_{b\_k} + k_L \cdot 3i_{0\_k})}{dt}\right] \\ u_{q\_c\_k} = u_{c\_k} - \left[R \cdot (i_{c\_k} + k_R \cdot 3i_{0\_k}) + L \cdot \frac{d(i_{c\_k} + k_L \cdot 3i_{0\_k})}{dt}\right] \\ k_R = \frac{R_0 - R_1}{3R_1} \quad k_L = \frac{L_0 - L_1}{3L_1} \end{cases} \quad (18)$$

wherein $u_{a\_k}$, $u_{b\_k}$ and $u_{c\_k}$ respectively represent line voltages for phase A, phase B and phase C at the sampling point; $i_{a\_k}$, $i_{b\_k}$ and $i_{c\_k}$ respectively represent currents for phase A, phase B and phase C at the sampling point; $R_0$ represents zero sequence resistance of the power line; $R_1$ represents positive sequence resistance of the power line; $L_0$ represents zero sequence inductance of the power line; $L_1$ represents positive sequence inductance of the power line; $i_{0\_k}$, represents zero sequence current at instant k; $K_R$ represents a factor determined based on $R_0$, $R_1$; $K_L$ represents a factor determined based on $L_0$, $L_1$.

Besides the time domain lumped parameter model, the phase compensation voltage and the interphase compensation voltage may also be determined by a telegraph equation model. The transmission line model based on the telegraph equation model is presented here for a single-phase line in the equation below.

$$\begin{cases} -\dfrac{\partial u}{\partial x} = ri + l\dfrac{\partial i}{\partial t} \\ -\dfrac{\partial i}{\partial x} = gu + c\dfrac{\partial u}{\partial t} \end{cases} \quad (19)$$

wherein u and i are the voltage and current at a sampling point on the power line; and r, l, g and c are respectively resistance, inductance, conductance and capacitance per unit length of the power line.

If the line is free from distortion, a simple solution of the equation (19), where the voltage and the current at the sampling point "q" on the power line may be expressed as the sum of a forward wave and a backward wave according an equation below.

$$\begin{cases} u_q(t) = u_q^+(t) + u_q^-(t) \\ i_q(t) = i_q^+(t) + i_q^-(t) \end{cases} \quad (20)$$

wherein $u_q^+(t)$ and $u_q^*(t)$ are respectively the waves moving in the positive and negative direction of the power line. With the aid of sampled values of the voltage $u_0$ and current $i_0$, the voltage (i.e., phase compensation voltage) at a distance $d_q$ from the sampling point can be calculated as derived in the equation below.

$$u_q(t) = \dfrac{D_q}{2}[u_0(t-T_q) + Zi_0(t-T_q)] + \dfrac{1}{2D_q}[u_0(t+T_q) + Zi_0(t+T_q)] \quad (21)$$

wherein the first term $$\dfrac{D_q}{2}[u_0(t-T_q) + Zi_0(t-T_q)]$$

represents the wave in the forward direction and the second term $$\dfrac{1}{2D_q}[u_0(t+T_q) + Zi_0(t+T_q)]$$

represents the backward wave; the wave impedance Z, attenuation factor $D_q$, and transit time $T_q$ are defined by the following equation.

$$\begin{cases} Z = \sqrt{l/c} \\ D_q = e^{-\frac{rd_q}{Z}} \\ T_q = d_q\sqrt{lc} \end{cases} \quad (22)$$

Figure 9:
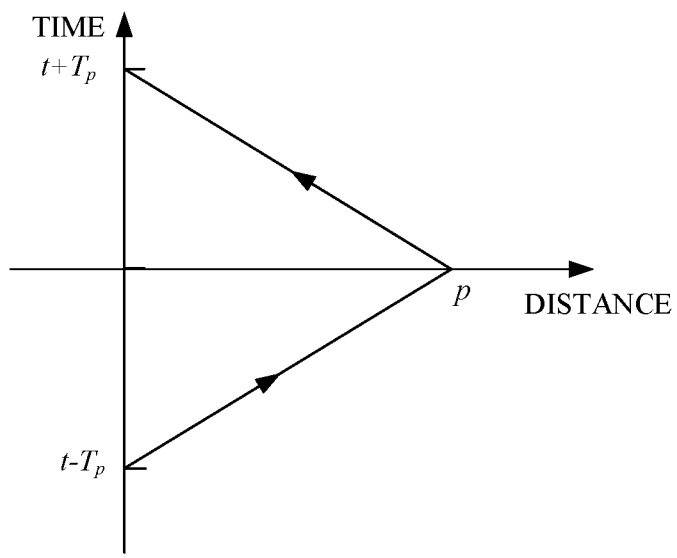
FIG. 9 shows the general expression for the model voltage at any point along the power line.

FIG. 9 shows the expression in the above equation (21), which is the general expression for the model voltage at any point along the power line. It should be understood that the equations (19)-(22) apply to single-phase systems. As mentioned above, power lines normally consist of three or possible more phases. It is well know that a symmetrical multi-phase system can be divided into independent modes. In this way, by suitable transformation, a symmetrical three-phase system can be divided into three single-phase systems which are independent of each other. By applying the equations (19)-(22), the phase compensation voltages $u_{qa}$, $u_{qb}$ and $u_{qc}$ and the interphase compensation voltages $u_{qa\_Equ}$, $u_{qb\_Equ}$ and $u_{qc\_Equ}$ can be determined in the time domain as well.

After the phase compensation voltage of the first phase and the interphase compensation voltage between the second and third phases in time domain are determined, the phase compensation voltage and the interphase compensation voltage can then be compared to detect the line fault. For example, according to the common knowledge in distance relay, and from the above equation (8), we can get the equation below.

$$\begin{cases} LA\ 270° \geq \arg\dfrac{\dot{U}_{qa\_Equ}}{\dot{U}_{qa}} \geq 90° \longrightarrow |u_{qa} + u_{qa\_Equ}| \leq |u_{qa} - u_{qa\_Equ}| \\ LB\ 270° \geq \arg\dfrac{\dot{U}_{qb\_Equ}}{\dot{U}_{qb}} \geq 90° \longrightarrow |u_{qb} + u_{qb\_Equ}| \leq |u_{qb} - u_{qb\_Equ}| \\ LC\ 270° \geq \arg\dfrac{\dot{U}_{qc\_Equ}}{\dot{U}_{qc}} \geq 90° \longrightarrow |u_{qbc} + u_{qc\_Equ}| \leq |u_{qbc} - u_{qc\_Equ}| \end{cases} \quad (23)$$

$$\begin{cases} \dot{U}_{qa\_Equ} = (\dot{U}_{qb} - \dot{U}_{qc}) \times e^{j90°} = \dot{U}_{qbc} \times e^{j90°} \\ \dot{U}_{qb\_Equ} = (\dot{U}_{qc} - \dot{U}_{qa}) \times e^{j90°} = \dot{U}_{qca} \times e^{j90°} \\ \dot{U}_{qc\_Equ} = (\dot{U}_{qa} - \dot{U}_{qb}) \times e^{j90°} = \dot{U}_{qab} \times e^{j90°} \end{cases} \quad (24)$$

wherein $\dot{U}_{qa\_Equ}$ represents an equivalent compensation voltage between phases B and C after rotating 90°; $\dot{U}_{qb\_Equ}$ represents an equivalent compensation voltage between phases A and C after rotating 90°; $\dot{U}_{qc\_Equ}$ represents an equivalent compensation voltage between phases A and B after rotating 90°; $\dot{U}_{qa}$, $\dot{U}_{qb}$, and $\dot{U}_{qc}$ represent the phase compensation voltages for phases A, B and C in frequency domain; $u_{qa}$, $u_{qb}$ and $u_{qc}$ represent the phase compensation voltages for phases A, B and C, i.e., $u_{qa}=u_{q\_a\_k}$, $u_{qb}=u_{q\_b\_k}$ and $u_{qc}=u_{q\_c\_k}$; and $u_{qa\_Equ}$, $u_{qb\_Equ}$ and $u_{qc\_Equ}$ represents the interphase compensation voltages, $u_{q\_ab\_k}$, $u_{q\_bc\_k}$ and $u_{q\_ca\_k}$ in time domain.

Thus, before comparing the phase compensation voltage and the interphase compensation voltage, an operation voltage can be determined by calculating a first absolute value of the phase compensation voltage minus the interphase compensation voltage, i.e., $|u_{qa}-u_{qa\_Equ}|$. In addition, a restrain voltage may also be determined by calculating a second absolute value of the phase compensation voltage plus the interphase compensation voltage, i.e., $|u_{qa}+u_{qa\_Equ}|$.

Then, we can compare the operation voltage and the restrain voltage. When the operation voltage is larger than or equal to the restrain voltage, it can be determined that there is a line fault in the first phase and/or the interphase loop between the second and third phases.

It can be seen from the above that the above methods of determining the phase compensation voltage and the interphase compensation voltage in time domain have nothing to do with the frequency. As a result, the influence on the fault determination due to the frequency such as the different frequencies of two power sources can be prevented, resulting in improved reliability of the fault determination.

It is to be understood that the above methods for determining the compensation voltages in frequency domain and determining the compensation voltages in time domain can be used at the same time to complement and verify each other. For example, when comparing the compensation voltages, we can use equation (23) to compare the amplitudes of the compensation voltages while comparing the phase angle according to equation (8). In this way, the reliability of the fault determination can be further improved.

Figure 10:
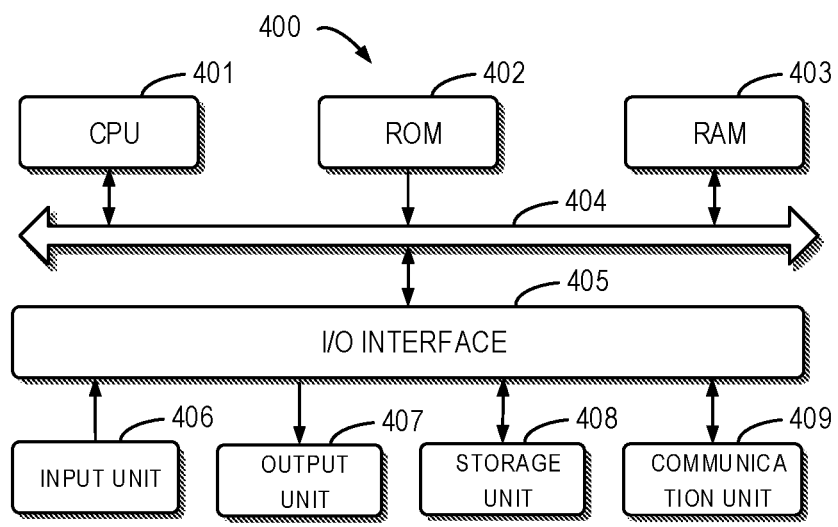
FIG. 10 shows a schematic block diagram of an example device 400 adapted to implement embodiments of the present disclosure.

According to other aspects of the present disclosure, an electronic device that can implement embodiments of the present disclosure as mentioned above is provided. FIG. 10 shows a schematic block diagram of an example device 400 adapted to implement embodiments of the present disclosure. For example, the fault diagnosis device 110 may be implemented by the device 400. As shown therein, the device 400 comprises a central processing unit (CPU) 401 that may perform various appropriate actions and processing based on computer program instructions stored in a read-only memory (ROM) 402 or computer program instructions loaded from a storage section 408 to a random access memory (RAM) 403. In the RAM 403, various programs and data needed for operations of the device 400 are further stored. The CPU 401, ROM 402 and RAM 403 are connected to each other via a bus 404. An input/output (I/O) interface 405 is also connected to the bus 404.

The following components in the device 400 are connected to the I/O interface 405: an input unit 406, such as a keyboard, a mouse and the like; an output unit 407, such as various kinds of displays and a loudspeaker, etc.; a memory unit 408, such as a magnetic disk, an optical disk, etc.; a communication unit 409, such as a network card, a modem, a wireless communication transceiver, etc. The communication unit 409 allows the device 400 to exchange information/data with other devices through a computer network such as the Internet and/or various kinds of telecommunications networks.

Various processes and processing described above, e.g., the method 600, may be executed by the processing unit 401. For example, in some embodiments, the method 600 may be implemented as a computer software program that is tangibly embodied on a machine readable medium, e.g., the storage unit 408. In some embodiments, part or all of the computer programs may be loaded and/or mounted onto the device 400 via ROM 402 and/or communication unit 409. When the computer program is loaded to the RAM 403 and executed by the CPU 401, one or more acts of the method 600 as described above may be executed.

In some embodiments, the electronic device may be a distance relay such as an mho relay as mentioned above. With the methods according to embodiments of the present disclosure embedded in the distance relay, the reliability of the power transmission line can be significantly improved.

According to another aspect of the present disclosure, a computer readable storage medium (or media) having computer readable program instructions thereon for performing aspects of the present disclosure is provided.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the scenario involving the remote computer, the remote computer may be connected to the user's computer through any type of network, including a local area network (LAN) or a wide area network (WAN), or the connection may be made to an external computer (for example, through the Internet using an Internet Service Provider). In some embodiments, the electronic circuitry can be customized by utilizing state information of the computer readable program instructions, for example, programmable logic circuitry, field-programmable gate arrays (FPGA), or programmable logic arrays (PLA). The electronic circuitry may execute the computer readable program instructions, in order to perform aspects of the present disclosure.

Aspects of the present disclosure are described herein with reference to flowchart illustrations and/or block diagrams of methods, device (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can enable a computer, a programmable data processing apparatus, and/or other devices to function in a particular manner, such that the computer readable storage medium having instructions stored therein comprises an article of manufacture, which includes instructions implementing aspects of the function/act specified in block or blocks of the flowchart and/or block diagram.

The computer readable program instructions may also be loaded onto a computer, other programmable data processing apparatuses, or other device to cause a series of operational steps to be performed on the computer, other programmable data processing apparatuses or other devices to produce a computer implemented process, such that the instructions which execute on the computer, other programmable data processing apparatuses, or other devices implement the functions/acts specified in block or blocks of the flowchart and/or block diagram.

It should be appreciated that the above detailed embodiments of the present disclosure are only to exemplify or explain principles of the present disclosure and not to limit the present disclosure. Therefore, any modifications, equivalent alternatives and improvement, etc. without departing from the spirit and scope of the present disclosure shall be comprised in the scope of protection of the present disclosure. Meanwhile, appended claims of the present disclosure aim to cover all the variations and modifications falling under the scope and boundary of the claims or equivalents of the scope and boundary.

What is claimed is:

1. A method of determining a line fault of a power system, comprising:
    obtaining sampled values of voltages and currents of phases of a power line in the power system, the sampled values of voltages and currents being obtained by a relay, the phases at least comprising a first phase, a second phase and a third phase;
    determining, based on the sampled values of the voltages and currents, a phase compensation voltage of the first phase and an interphase compensation voltage of an interphase loop between the second phase and the third phase; and
    detecting the line fault in the first phase and/or the interphase loop by comparing the phase compensation voltage and the interphase compensation voltage, wherein determining the interphase compensation voltage further comprises:
        determining a second compensation voltage of the second phase and a third compensation voltage of the third phase based on the sampled values of the voltages and currents; and
        determining the interphase compensation voltage based on at least one of the second phase compensation voltage or third phase compensation voltage.

2. The method of claim 1, wherein determining the phase compensation voltage of the first phase comprises:
    obtaining a set impedance of the power line, the set impedance being 80%-85% of a total impedance of the power line;
    determining a first phasor voltage and a first phasor current of the first phase based on the sampled values of the voltages and currents; and
    determining the phase compensation voltage of the first phase at least based on the set impedance, the first phasor voltage and the first phasor current.

3. The method of claim 2, wherein determining the phase compensation voltage further comprises:
    determining a compensation coefficient based on a zero sequence impedance and a positive sequence impedance of the power line;
    determining a second phasor current of the second phase and a third phasor current of the third phase based on the sampled values of the voltages and currents;
    determining a zero sequence current based on the first phasor current, the second phasor current, and the third phasor current; and
    determining the phase compensation voltage further based on the compensation coefficient and the zero sequence current.

4. The method of claim 1, wherein detecting the line fault in the first phase and/or the interphase loop comprises:
    determining a phase angle between the phase compensation voltage and the interphase compensation voltage; and
    in accordance with a determination that the phase angle is within a predetermined range, determining a presence of the line fault in at least one of the first phase or the interphase loop.

5. The method of claim 1, wherein the phase compensation voltage and the interphase compensation voltage are determined in a time domain according to at least one of a time domain lumped parameter model or a telegraph equation model.

6. The method of claim 5, wherein determining the phase compensation voltage further comprises:
    obtaining a resistance of the power line and a phase inductance of the first phase, the second phase, and the third phase and an interphase inductance among the first phase, the second phase, and the third phase; and
    determining the phase compensation voltage in the time domain based on the resistance, the phase inductance, the interphase inductance, the sampled values of the voltages and currents, and a change rate of the sampled values of the currents.

7. The method of claim 6, wherein determining the phase compensation voltage further comprises:
    obtaining a positive sequence resistance, an inductance, a resistance compensation factor and an inductance compensation factor of the power line;
    determining a zero sequence current based on the sampled values of the voltages and currents; and
    determining the phase compensation voltage in the time domain based on the positive sequence resistance, the inductance, the sampled values of the voltages and currents and the zero sequence current.

8. The method of claim 7, wherein determining the interphase compensation voltage comprises:
- obtaining interphase sampled values of an interphase voltage and an interphase current between the second phase and the third phase, the sampled values being obtained by a relay; and
- determining the interphase compensation voltage in the time domain based on the resistance, the inductance, the interphase sampled values, and a change rate of the interphase sampled value of the interphase current.

9. The method of claim 5, wherein detecting the line fault in the first phase and/or the interphase loop comprises:
- determining an operation voltage by calculating a first absolute value of the phase compensation voltage minus the interphase compensation voltage;
- determining a restrain voltage by calculating a second absolute value of the phase compensation voltage plus the interphase compensation voltage; and
- detecting the line fault in the first phase and/or the interphase loop by comparing the first absolute value with the second absolute value.

10. An electronic device, comprising:
- at least one processing unit; and
- at least one memory coupled to the at least one processing unit and storing instructions executable by the at least one processing unit, the instructions, when executed by the at least one processing unit, causing the electronic device to perform the method according to claim 1.

11. The electronic device of claim 10, wherein the electronic device comprises a distance relay used in a power system.

12. A computer readable storage medium having computer readable program instructions stored thereon which, when executed by a processing unit, cause the processing unit to perform the method according to claim 1.

13. The method of claim 1, wherein detecting the line fault in the first phase and/or the interphase loop comprises:
- determining a phase angle between the phase compensation voltage and the interphase compensation voltage; and
- in accordance with a determination that the phase angle is within a predetermined range, determining a presence of the line fault in at least one of the first phase or the interphase loop.

14. The method of claim 1, wherein the phase compensation voltage and the interphase compensation voltage are determined in a time domain according to at least one of a time domain lumped parameter model or a telegraph equation model.

15. The method of claim 14, wherein determining the phase compensation voltage further comprises:
- obtaining a resistance of the power line and a phase inductance of the first phase, the second phase, and the third phase and an interphase inductance among the first phase, the second phase, and the third phase; and
- determining the phase compensation voltage in the time domain based on the resistance, the phase inductance, the interphase inductance, the sampled values of the voltages and currents, and a change rate of the sampled values of the currents.

16. The method of claim 15, wherein determining the phase compensation voltage further comprises:
- obtaining a positive sequence resistance, an inductance, a resistance compensation factor and an inductance compensation factor of the power line;
- determining a zero sequence current based on the sampled values of the voltages and currents; and
- determining the phase compensation voltage in the time domain based on the positive sequence resistance, the inductance, the sampled values of the voltages and currents and the zero sequence current.

17. The method of claim 16, wherein determining the interphase compensation voltage comprises:
- obtaining interphase sampled values of an interphase voltage and an interphase current between the second phase and the third phase, the sampled values being obtained by a relay; and
- determining the interphase compensation voltage in the time domain based on the resistance, the inductance, the interphase sampled values, and a change rate of the interphase sampled values of the interphase current.

18. The method of claim 14, wherein detecting the line fault in the first phase and/or the interphase loop comprises:
- determining an operation voltage by calculating a first absolute value of the phase compensation voltage minus the interphase compensation voltage;
- determining a restrain voltage by calculating a second absolute value of the phase compensation voltage plus the interphase compensation voltage; and
- detecting the line fault in the first phase and/or the interphase loop by comparing the first absolute value with the second absolute value.

* * * * *